United States Patent [19]
Boren

[11] Patent Number: 5,226,057
[45] Date of Patent: Jul. 6, 1993

[54] RECEIVER AND ADAPTIVE DIGITAL NOTCH FILTER

[75] Inventor: Thomas A. Boren, Garland, Tex.

[73] Assignee: Rockwell International Corporation, Seal Beach, Calif.

[21] Appl. No.: 672,289

[22] Filed: Mar. 20, 1991

[51] Int. Cl.⁵ .................. H04B 1/10; G06F 15/31
[52] U.S. Cl. ............................ 375/103; 455/295; 455/307; 364/724.01
[58] Field of Search .............. 375/103; 455/206, 295, 455/307; 333/176; 364/724.01

[56] References Cited
U.S. PATENT DOCUMENTS

| | | | |
|---|---|---|---|
| 4,658,368 | 4/1987 | Blais | 364/724.01 |
| 4,751,663 | 6/1988 | Yamazaki | 364/724.01 |
| 4,908,787 | 3/1990 | Dyer | 364/724.01 |

Primary Examiner—Curtis Kuntz
Assistant Examiner—Young Tse
Attorney, Agent, or Firm—V. Lawrence Sewell; H. Fredrick Hamann; T. M. Blackwood

[57] ABSTRACT

Adaptive IIR digital notch filters useful with RF receivers for reducing interference. One or more notch filters automatically tune, to an interferer frequency, via adapting of coefficients in the z-transform. Each notch tunes independently of any other.

25 Claims, 3 Drawing Sheets

RECEIVER AND ADAPTIVE DIGITAL NOTCH FILTER

BACKGROUND OF THE INVENTION

This invention relates to digital filters for reducing unwanted signals or noise (i.e., interference) and in the preferred embodiment to adaptive IIR (infinite-impulse-response) digital notch filters for use with receiver baseband signals.

DESCRIPTION OF THE RELATED ART

Adaptive notch filters are described and discussed in various publications. For example, the art shows a filter having double notches whose two notch locations are not independently setable [1]. In another prior art adaptive notch filter [2], the method of adapting can be too computationally intensive for some applications.

REFERENCES

[1] N. Cho, C. Choi, S. Lee, "Adaptive Line Enhancement by Using an IIR Lattice Notch Filter", IEEE Transactions on Acoustics, Speech, and Signal Processing; Vol. 37, No. 4, Apr., 1985, pp. 585-589.

[2] A. Nehorai, "A Minimal Parameter Adaptive Notch Filter With Constrained Poles and Zeroes", IEEE Transactions on Acoustics, Speech, and Signal Processing; Vol. ASSP-33, No. 4, Aug., 1985, pp. 983-996.

SUMMARY OF THE INVENTION

In accordance with the present invention, an adaptive digital notch filter affords a lessened computational burden while simultaneously enabling the effecting of one or more single notches, the location of each notch being independent of the location of any other notch.

These and other features, objects, and advantages of the invention will become more apparent upon reference to the following specification, claims, and appended drawings in which:

BRIEF DESCRIPTION OF THE DRAWING

FIG. 2b is a more detailed flow chart representation of step 55 of FIG. 2a; and

DESCRIPTION OF THE PREFERRED EMBODIMENT

Figure 1:
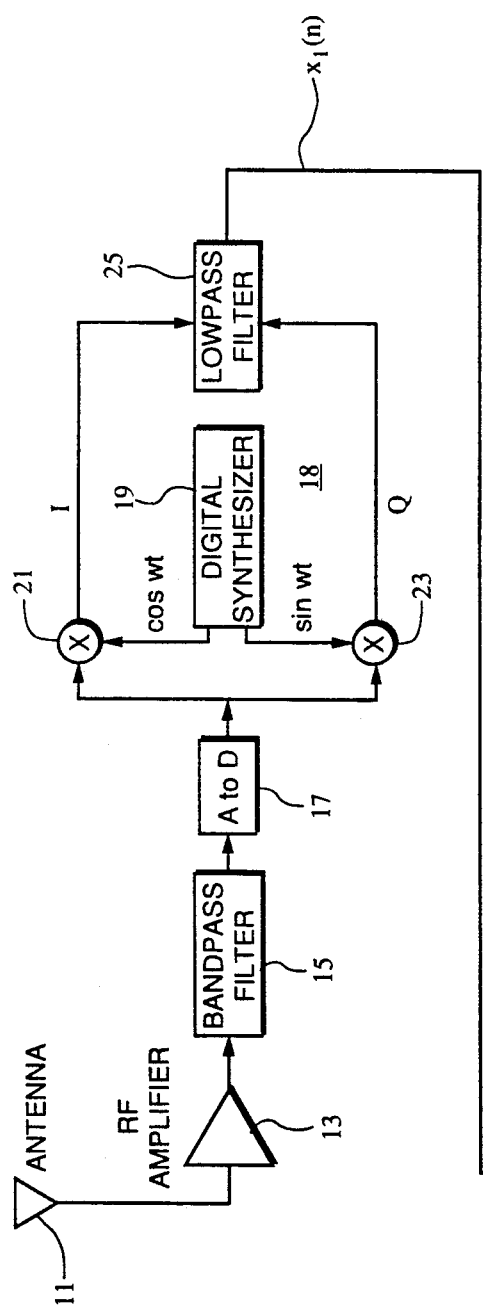
FIG. 1 is a block diagram of a radio receiver and represents a preferred application.
Figure 1:
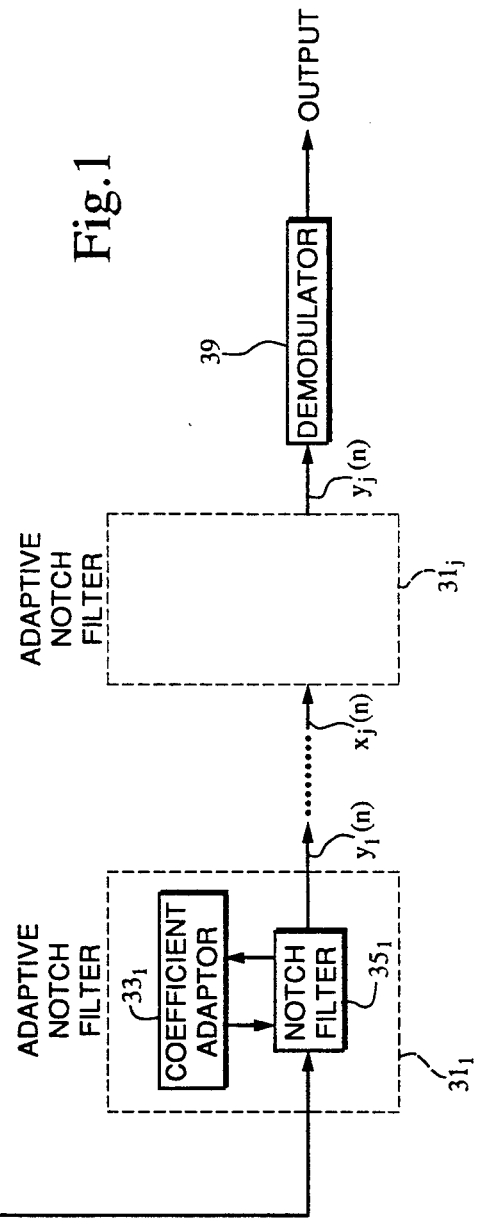

Referring now to FIG. 1, a radio receiver 10 is shown in which filtering in accordance with the present invention is accomplished. Operating in the very low frequency (vlf) band, intelligence-bearing vlf radio frequency (RF) signals received by antenna 11 are supplied to an RF amplifier 13 (for moderate RF gain) and then on to bandpass filter 15 which, for a typical RF carrier frequency of 30 kilohertz, typically attenuates by 130 db or more all RF above 200 kilohertz. The RF output from filter 15 is then converted to digital form by A-to-D converter 17.

Translator 18 receives the digital form of RF from converter 17 and performs a complex mixing and low pass filtering to produce a digital baseband signal $x_1(n)$ having I and Q (i.e., quadrature) components. Translator items 21 and 23 comprise mixers which both receive the converter 17 output and which use, respectively, the cosine and sine injections from digital synthesizer 19 to produce the quadrature-phased components I and Q. Translator item 25, which may be either two like low-pass filters operating in parallel, or one filter operating serially on I and Q, typically reduces by 140 db or more all frequencies above the anticipated top frequency of the intelligence. Typically, low-pass filter 25 provides a 140 db cutoff at 2 kilohertz.

Digital baseband signal $x_1(n)$ is then fed to a filtering system comprising one or more cascade-connected adaptive notch filters 31 (i.e., $31_1$ through $31_j$), the purpose being to eliminate or reduce narrowband interferers corrupting $x_1(n)$, such as emi from on-board power systems and/or other co-located equipment (e.g., 60 hertz and 400 hertz emi) and emi from external jammers. The filtering system output $y_j(n)$ is then demodulated by 39 to retrieve the intelligence.

The number of adaptive notch filters 31 employed (i.e., the number j) is usually equal to the number of interferers anticipated. If a single harmonic of a 60 hertz interference is the only problem anticipated, only one adaptive notch filter would usually be employed. If single harmonics of both 60 and 400 hertz interferers are anticipated, j would normally be equal to two. In the latter example, filter $31_1$ would automatically tune itself (i.e., adapt itself) to filter out one of the 60 hertz harmonic or 400 hertz harmonic interferers. The other filter, i.e., $31_2$, would tune/adapt itself to filter out the remaining interferer; i.e., the one not tuned by $31_1$. The filtering system may be extended to have a higher number of notches by simply cascading such number of filters. The anticipated number of notches increases with increasing width of passband of interest because of likelihood of incurring additional harmonics. The filters adapt/tune independently of one another so as to tune to any combination of interferers. A floating point digital signal processor, such as a TI TMS 320C30, is currently used to implement a finite set of the adaptive notch filters 31 operating under the program shown in the software listing appearing hereinafter at Appendix I. Such Appendix I is in C programming language.

Each of the adaptive notch filters may be characterized as a notch filter portion plus a coefficient adapter portion. The z-transform transfer function of the filter portion is given by:

$$H(z) = (1 + k^* z^{-1})/(1 + a^* z^{-1})$$

where * (i.e., the asterisk) represents the complex conjugate operator and $k^*$ and $a^*$ are the coefficients calculated and adapted by the coefficient adapter portion. (To briefly review, a complex variable V has real and imaginary components and may be represented as $(V_1 + JV_2)$ where $J^2 = -1$. By definition then, $V^*$ is $(V_1 - JV_2)$.)

The coefficients adapt in accordance with the following coefficient update equations:

$$a^* = Bk^*$$

$$k = (k_R)/(W)$$

$$W = |k_R|$$

$$k_R = -C(n)/D(n)$$

$$C(n) = GC(n-1) + P(n-1)P^*(n)$$

$$D(n) = GD(n-1) + P(n-1)P^*(n-1)$$

In the present embodiment, G is a forgetting multiplier selected to have a value less than 1. B is a scaling multiplier that determines the width of the notch and is selected to have a value less than 1. P(n) is forward prediction error at sample n. P(n−1) is forward prediction error at the preceding sample, namely, sample (n−1). More specifically, $$P(n) = x(n) - a^*P(n-1)$$
$$= y(n) - k^*P(n-1)$$

Figure 2B:
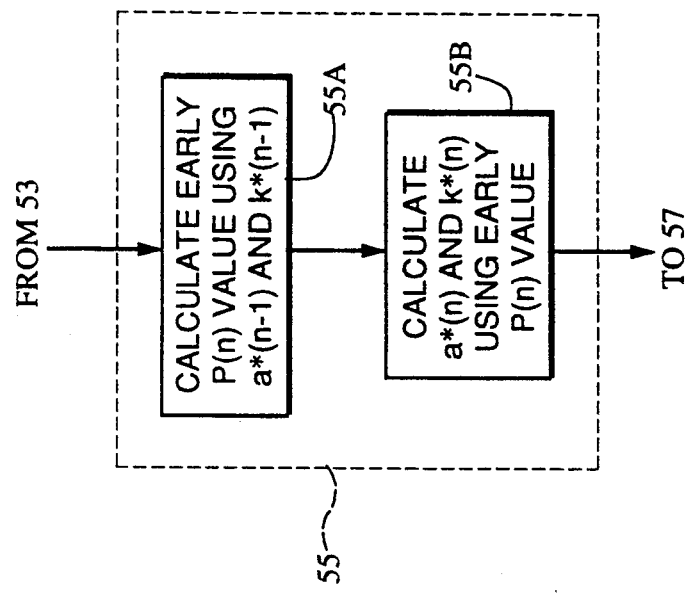
Figure 2A:
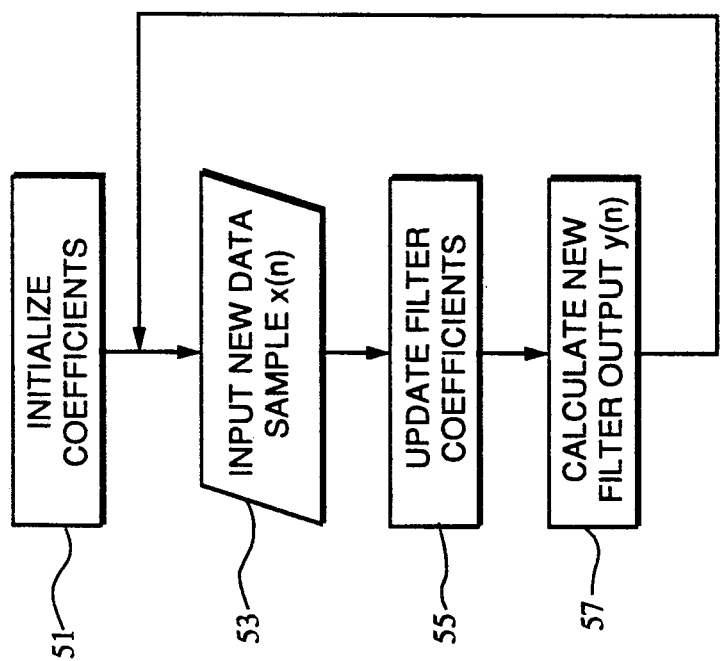
FIG. 2a is a flow chart representation of the operation of item 31 of FIG. 1.

As seen in FIG. 2a, the sequence of operating events is as follows. In step 51, the coefficients $a^*$ and $k^*$ are initialized prior to receipt of a first input data sample. Usually such coefficients are initialized at a value of zero, but if it is known, for example, that the filter is intended to remove a 60 hertz interferer, the coefficients may be initialized at values closer to their final steady state values so as to reduce settling or convergence time.

In step 53, a new input data sample (i.e., x(n)), is acquired. In step 55, the coefficients $a^*$ and $k^*$ are updated during this new input data sample. In step 57, the new filter output y(n) is calculated using the updated coefficients. The sequence then repeats at the next input data sample except that the coefficient values as were last computed replace the initialized values. Thus, the coefficients are iteratively computed at each new input data sample. Likewise, the output is iteratively computed, at each new input sample, using the most recently computed values of the coefficients $a^*$ and $k^*$. After a number of iterations using new input samples, the coefficients $a^*$ and $k^*$ converge to substantially steady state values such that the interferer existing in x(n) is nulled or minimized in y(n).

FIG. 2b shows step 55 in additional detail. In general, two computations of P(n) are made during any one input sample and the resulting values of P(n) are referred to now as the "early" value and the "late" value. As indicated in step 55A, the early value of P(n) is calculated using the values of $a^*$ and $k^*$ corresponding to the just-preceding input sample. Then, in step 55B, the $a^*$ and $k^*$ for the present sample are calculated using the early value of P(n). As a result of step 57, the late value of P(n) is automatically computed using present $a^*$ and $k^*$, such late value replacing the early value, and thus the late value of P(n) is used in the calculation of Y(n).

Figure 3:
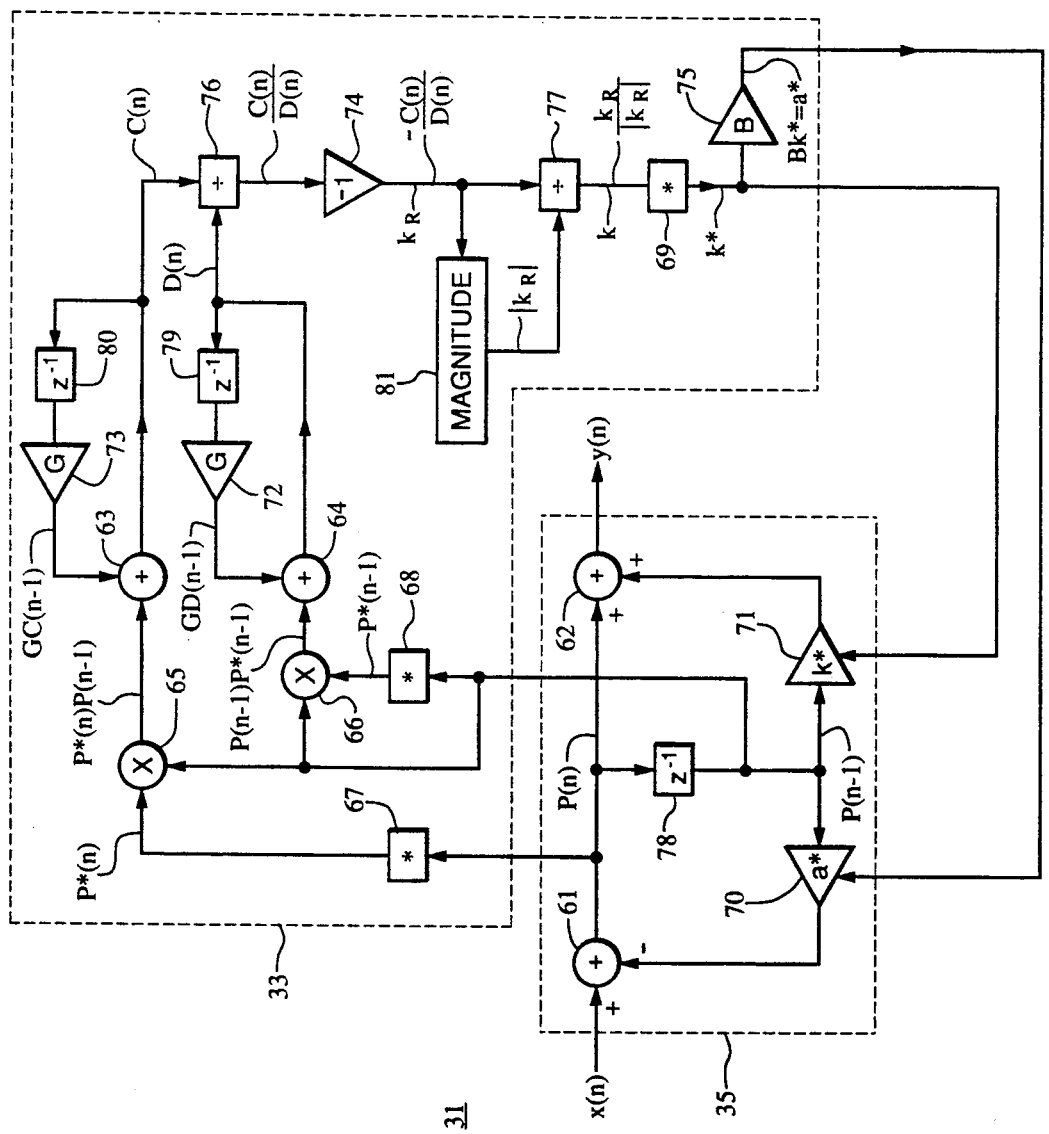
FIG. 3 is a computational diagram representation of FIG. 1 item 31 and its operation.

Signal flow and computation, within one of filters 31, are represented by the FIG. 3 diagram. The symbols employed in FIG. 3 are intended to be self explanatory and to represent common operations, but to briefly elaborate, Items 62, 63 and 64 each effects a sum of its inputs. Item 61 effects a difference of its inputs. Items 65 and 66 each effect a multiplication of its inputs. Items 67, 68 and 69 each effect an output which is the complex conjugate of its input. Items 70, 71, 72, 73, 74 and 75 each effect an output which is the product of the input and the multiplier shown inside the triangle. Items 76 and 77 effect division of their inputs. Items 78, 79 and 80 effect unit delays such that their outputs for the present sample are their inputs for the previous sample. Item 81 effects an output that is the magnitude of its input.

Turning now to the processing as represented by FIG. 3, it will be assumed first that the coefficients $a^*$ and $k^*$ have been computed for, and are at their proper values for, the present input sample. Accordingly, examining the processing represented by FIG. 3, Item 35, the preset input sample x(n) is summed via 61 with $[-a^*P(n-1)]$ to produce the "late" value of P(n) (which thereby automatically replaces the "early" value), and such late value of P(n) is summed via 62 with $k^*P(n-1)$ to produce output y(n) corresponding to the present input sample. P(n−1) is, of course, the "late" value of forward prediction error P produced during the just-preceding input sample.

Examining now the coefficient adapting/processing represented by FIG. 3, Item 33, the complex conjugates of P(n) and P(n−1) are effected via 67 and 68, and two products, namely, $P^*(n)P(n-1)$ and $P(n-1)P^*(n-1)$, are effected via 65 and 66. These products are summed, respectively, via 63 and 64, with two other products, namely, GC(n−1) and GD(n−1) to effect, respectively, C(n) and D(n), whose ratio, following signal reversal, normalization, and the taking of the complex conjugate, is the coefficient $k^*$. G is a multiplier having value less than one. C(n−1) and D(n−1) are the values of C and D, respectively, corresponding to the preceding input sample. The coefficient $a^*$ is equal to the product $Bk^*$ where B is a multiplier having value less than one. As indicated previously, the coefficients $a^*$ and $k^*$ serve, via 70 and 71, as multipliers of P(n−1) so as to produce two quantities, namely, $a^*P(n-1)$ and $k^*P(n-1)$ which contribute, respectively, via 61 and 62, to P(n) and y(n).

Still referring to FIG. 3, it is seen that the filter portion 35 is a form of lattice and is a single-pole single-zero filter whose z-transform transfer function H(z) is given by:

$$(1+k^*z^{-1})/(1+a^*z^{-1})$$

A notch arises when $|k^*|$ is about a value of one, and if $a^*$ is an appropriate fraction B of $k^*$. The value of B determines the notch width in that the closer the pole is to the unit circle (i.e., for B approaching a value of one) the narrower is the notch.

Ranges and values of B and G have been empirically selected for present embodiments. A presently preferred range of B is 0.6 to 0.99. The presently preferred value of B is approximately 0.9 (e.g., 0.9±2 to 3 percent). A presently preferred range of G is 0.5 to 0.99, with the presently preferred portion of such range being 0.85 to 0.99. The presently preferred value of G is approximately 0.95 (e.g., 0.95±2 to 3 percent). It has also been found advantageous to have B fixed at a value somewhat less than its maximum when G is simultaneously fixed at a value near its maximum. For example, it has been found advantageous to have B approximately equal to 0.9 when G is simultaneously approximately 0.95. Another relationship that can be beneficial is to have G fixed at a value less than its maximum when B is simultaneously fixed at a value near its maximum. These ranges and values and relationships have, in tests, afforded preferred combinations of (i) capture/convergence time and (ii) notch width.

The coefficient $k^*$ is normalized (i.e., $k = k_R/|k_R|$) so that the zero is guaranteed to lie on the unit circle. The filter is thereby inherently stable because the pole is located inside the unit circle (i.e., $a^* = Bk^*$, and $B < 1$). No further stability monitoring is required. The current implementation performs well without the normalization but normalization is preferred.

The relationship of k to the notch frequency is given by:

$$Re\{k\} = -\cos(2\pi f_O/f_s)$$

$$Im\{k\} = \sin(2\pi f_O/f_s)$$

where $f_O$=notch frequency and $f_s$=sample rate (i.e., rate of x(n) input data samples). A typical value of $f_s$ is 3200 hertz.

Applications are contemplated where it may be advantageous to effect variability of the values of B and G, particularly within their preferred ranges. Such variability might be effected by a manual tuning or setting or adjusting or might be effected by an automatic tuning/adapting. Other possible applications include use of the filter with signals x(n) where x(n) is not a complex variable.

As indicated above, normalization of coefficient k is preferred because same guarantees stability of the filter. However, if insuring stability is not a priority, the filter may be implemented without effecting the normalization of the coefficient k. When normalization of k is not accomplished, the quantity W in the update equations shown hereinabove, would be equal to something other than $|k_R|$. For example, W could be equal to a constant q of a preselected value. The filter has performed well in an un-normalized mode where, in effect, W=q=1, and it is contemplated that other constant values of q may be useful in some applications. If W is chosen to be a predetermined constant q, the computational steps indicated at 81 and 77 in FIG. 3 would be deleted and could be replaced with a computational multiplication step (comparable to step 75) where multiplication of $k_R$ by 1/q would be effected. If W is chosen to be a predetermined constant q where q is equal to one, steps 81 and 77 in FIG. 3 would be deleted so that computation could proceed directly from step 74 to step 69.

Thus, while a particular embodiment of the present invention has been shown and described, it is apparent that changes and modifications may be made therein without departing from the invention in its broader aspects. The aim of the appended claims, therefore, is to cover all such changes and modifications as fall within the true spirit and scope of the invention.

In the following software listing, the function identified as "divt" takes the reciprocal of the variable "denom". The function identified as "sqrtt" takes the square root of the variable "denom".

---

SOFTWARE LISTING
Copyright TM 1990, Rockwell International Corporation
All Rights Reserved

---

```
/* This routine implements the IIR NBIS. This version is set up
for a 4-notch system but that is settable by changing the value of
m1. */
        int m1=4;
        float alpha=.9;
        float lambda=.9;
        float denom=1.0;
        float s01r[4];
        float s01i[4];
        float s01r_1[4];
        float s01i_1[4];
        float s21r;
        float s21i;
        float k0r[4];
        float k0i[4];
        float c1r[4];
        float c1i[4];
        float d1[4];
        float mag;
        int k;
void notch( )
{
        s21r=i_sample;
        s21i=q_sample
/* load R6 and R7 into s21r and 221i in .asm */
for(k=0; k<m1; k++)
        s01r[k]=s21r-(alpha*k0r[k])*s01r_1[k]-alpha*k0i[k]*s01i_1[k];
        s01i[k]=s21i-(alpha*k0r[k])*s01i_1[k]+alpha*k0i[k]*s01r_1[k];
        c1r[k]=lambda*c1r[k]+(s01r_1[k]*s01r[k]+s01i_[k]*s01i[k]);
        c1i[k]=lambda*c1i[k]+(s01i_1[k]*s01r[k]-s01r_[k]*s01i[k]);
        d1[k]=lambda*d1[k]+(s01r_1[k]*s01r_1[k]+s01i_1[k]*s01i_1[k]);
        s21r=s21r+(1-alpha)*k0r[k]*s01r_1[k]+(1-alpha)*k0i[k]*s01i_1[k];
        s21i=s21i+(1-alpha)*k0r[k]*s01i_1[k]-(1-alpha)*k0i[k]*s01r_1[k];
        if(d1[k] != 0.0)
        {
          denom=d1[k];
          divt( );
          k0r[k]=-c1r[k]*denom;
          k0i[k]=-c1i[k]*denom;
        }
        denom=k0r[k]*k0r[k]+k0i[k]*k0i[k];
        sqrtt( );
        mag=denom;
        k0r[k]*=mag;
        k0i[k]*=mag;
}
i_sample=s21r;
q_sample=s21i;
```

-continued

SOFTWARE LISTING
Copyright ™ 1990, Rockwell International Corporation
All Rights Reserved

```
/* load s21r and s21i into R6 and R7 in .asm */
    for(k=0; k<m1; k++)
    {
      s01r_1[k]=s01r[k];
      s01i_1[k]=s01i[k];
    }
    return;
}
```

What is claimed is:

1. A receiver comprising:
   first means for producing a digital baseband signal $x(n)$ and
   second means for (i) filtering out narrowband interference corrupting $x(n)$ and (ii) producing an output $y(n)$,
   said second means comprising an adaptive digital notch filter connected for receiving $x(n)$ and having z-transform transfer function $H(z)$, said $$H(z)=(1+k^*z^{-1})/(1+a^*z^{-1})$$

where
   $a^* = Bk^*$
   $^*$ is the complex conjugate operator
   B is a selected multiplier less than 1
   $k = (k_R)/(W)$
   $k_R = -C(n)/D(n)$
   $C(n) = GC(n-1) + P(n-1)P^*(n)$
   $D(n) = GD(n-1) + P(n-1)P^*(n-1)$ $$\begin{aligned}P(n) &= x(n) - a^*P(n-1)\\ &= y(n) - k^*P(n-1)\end{aligned}$$

and G is a selected multiplier less than 1
   and W is a predetermined one of (I) $|k_R|$ or (II) a predetermined constant
   said $a^*$ and $k^*$ being iteratively computed and settling at substantially steady state values when the narrowband interference in $y(n)$ is minimized.

2. A receiver as defined in claim 1 wherein W is equal to $|k_R|$.

3. A receiver as defined in claim 2 wherein G is in the range of 0.5 to 0.99.

4. A receiver as defined in claim 3 wherein B is in the range of 0.6 to 0.99.

5. A receiver as defined in claim 4 wherein $x(n)$ has quadrature components.

6. A receiver as defined in claim 1 wherein G is in the range of 0.5 to 0.99.

7. A receiver as defined in claim 1 wherein G is in the range of 0.85 to 0.99.

8. A receiver as defined in claim 2 wherein G is fixed at a value of approximately 0.95.

9. A receiver as defined in claim 1 wherein B is in the range of 0.6 to 0.99.

10. A receiver as defined in claim 1 wherein B is fixed at a value of approximately 0.9.

11. A receiver as defined in claim 1 wherein B is fixed at a value of approximately 0.9 and G is fixed at a value of approximately 0.95.

12. A receiver comprising:
    first means producing a digital baseband signal $x_1(n)$, and second means for (i) filtering out a plurality of at least j of narrowband interferences corrupting $x_1(n)$ and (ii) producing an output $y_j(n)$,
    said second means comprising a plurality j of adaptive digital notch filters connected in cascade so that the first filter receives $x_1(n)$ and outputs $y_1(n)$, and the jth filter receives $x_j(n)=y_{j-1}(n)$ and outputs $y_j(n)$, said j filters each having a z-transform transfer function $H_i(z)$, said $$H_i(z)=(1+k_i^*z^{-1})/(1+a_i^*z^{-1})$$

where
    $i = 1 \ldots j$
    $a_i^* = B_i k_i^*$
    $^*$ is the complex conjugate operator
    $B_i$ is a selected multiplier less than 1
    $k_i = (k_{Ri})/(W_i)$
    $k_{Ri} = -C_i(n)/D_i(n)$
    $C_i(n) = G_i C_i(n-1) + P_i(n-1)P_i^*(n)$
    $D_i(n) = G_i D_i(n-1) + P_i(n-1)P_i^*(n-1)$ $$\begin{aligned}P_i(n) &= x_i(n) - a_i^*P_i(n-1)\\ &= y_i(n) - k_i^*P_i(n-1)\end{aligned}$$

and $G_i$ is a selected multiplier less than 1
    and $W_i$ is a predetermined one of (I) $|k_{Ri}|$ or (II) a predetermined constant $q_i$
    each said $a_i^*$ and $k_i^*$ being iteratively computed and settling at substantially steady state values when one of the narrowband interferences in $y_i(n)$ is minimized.

13. A receiver as defined in claim 12 wherein $W_i$ is equal to $|k_{Ri}|$.

14. A receiver as defined in claim 13 wherein each $G_i$ is in the range of 0.5 to 0.99.

15. A receiver as defined in claim 13 wherein each $G_i$ is in the range of 0.85 to 0.99.

16. A receiver as defined in claim 13 wherein each $G_i$ is fixed in value and each $G_i$ has a value of approximately 0.95.

17. A receiver as defined in claim 13 wherein each $B_i$ is fixed in value and each has a value of approximately 0.9, and each $G_i$ is fixed in value and each has a value of approximately 0.95.

18. A receiver as defined in claim 14 wherein each $B_i$ is in the range of 0.6 to 0.99.

19. A receiver as defined in claim 14 wherein each $B_i$ is fixed in value and each $B_i$ has a value of approximately 0.9.

20. An adaptive digital notch filter for use in (i) filtering a digital signal $x(n)$ corrupted with interference, and (ii) providing digital signal output $y(n)$ where the corrupting interference has been reduced, said filter having a z-transform transform function $H(z)$, said $$H(z)=(1+k^*z^{-1})/(1+a^*z^{-1})$$

where $a^* = Bk^*$

* is the complex conjugate operator

B is a selected multiplier less than 1

$k = (k_R)/(W)$ $k_R = -C(n)/D(n)$ $C(n) = GC(n-1) + P(n-1)P^*(n)$ $D(n) = GD(n-1) + P(n-1)P^*(n-1)$ $$\begin{aligned} P(n) &= x(n) - a^*P(n-1) \\ &= y(n) - k^*P(n-1) \end{aligned}$$

and G is a selected multiplier less than 1 and W is a predetermined one of (I) $|k_R|$ or (II) a predetermined constant said $a^*$ and $k^*$ being iteratively computed at new input samples and settling at substantially steady state values when the interference in y(n) is minimized.

21. A filter as defined in claim 20 wherein W is equal to $|k_R|$.

22. A filter as defined in claim 21 wherein B is in the range of 0.6 to 0.99, and G is in the range of 0.5 to 0.99.

23. A filter as defined in claim 22 wherein B is fixed at a value less than its maximum when G is simultaneously fixed at a value near its maximum.

24. A filter as defined in claim 23 where B is approximately 0.9 and G is simultaneously approximately 0.95.

25. A filter as defined in claim 22 wherein G is fixed at value less than its maximum when B is simultaneously fixed at a value near its maximum.

* * * * *